(12) United States Patent
Kazama et al.

(10) Patent No.: US 8,344,747 B2
(45) Date of Patent: Jan. 1, 2013

(54) PROBE UNIT

(75) Inventors: Toshio Kazama, Kamiina-gun (JP);
Kohei Hironaka, Kamiina-gun (JP);
Shigeki Ishikawa, Kamiina-gun (JP)

(73) Assignee: NHK Spring Co., Ltd., Yokohama-Shi (JP)

( * ) Notice: Subject to any disclaimer, the term of this patent is extended or adjusted under 35 U.S.C. 154(b) by 148 days.

(21) Appl. No.: 12/735,598

(22) PCT Filed: Jan. 22, 2009

(86) PCT No.: PCT/JP2009/050999
§ 371 (c)(1),
(2), (4) Date: Jul. 30, 2010

(87) PCT Pub. No.: WO2009/096318
PCT Pub. Date: Aug. 6, 2009

(65) Prior Publication Data
US 2011/0025358 A1    Feb. 3, 2011

(30) Foreign Application Priority Data
Feb. 1, 2008   (JP) .................................. 2008-023167

(51) Int. Cl.
*G01R 1/067* (2006.01)
*H01R 12/00* (2006.01)
(52) U.S. Cl. ................. 324/755.01; 324/755.11; 439/66
(58) Field of Classification Search ............. 324/755.01, 324/755.04–755.11; 439/66
See application file for complete search history.

(56) References Cited

U.S. PATENT DOCUMENTS

| | | | | |
|---|---|---|---|---|
| 6,334,247 | B1 * | 1/2002 | Beaman et al. | 29/842 |
| 6,655,983 | B1 * | 12/2003 | Ishikawa et al. | 439/482 |
| 6,677,772 | B1 * | 1/2004 | Faull | 324/755.05 |
| 7,057,403 | B2 * | 6/2006 | Kazama | 324/755.05 |

(Continued)

FOREIGN PATENT DOCUMENTS

CN    1646922 A    7/2005

(Continued)

OTHER PUBLICATIONS

International Search Report mailed on May 19, 2009 in corresponding PCT Application No. PCT/JP2009/050999.

(Continued)

*Primary Examiner* — Joshua Benitez Rosario
(74) *Attorney, Agent, or Firm* — Edwards Wildman Palmer LLP; James E. Armstrong, IV; Stephen D. LeBarron (57) ABSTRACT

A probe unit includes: large diameter probes; small diameter probes; a large-diameter probe holder having large hole portions which individually hold the large diameter probes, and reception hole portions which have diameters smaller than those of the large hole portions, communicate with the large hole portions, and receive end portions of the small diameter probes so that the end portions come into contact with the large diameter; and a small-diameter probe holder probes having small hole portions which individually hold the small diameter probes. The central axes of the large hole portion and the small hole portion that communicate with each other are separated from each other, and the small hole portions include two small hole portions which are adjacent to each other and of which central axes are separated from each other by a distance shorter than a distance between the central axes of two large hole portions that are corresponding to the two small hole portions.

9 Claims, 6 Drawing Sheets

U.S. PATENT DOCUMENTS

| | | | |
|---|---|---|---|
| 7,425,839 B2 * | 9/2008 | Stutzman et al. | 324/754.08 |
| 7,629,804 B2 * | 12/2009 | Nguyen et al. | 324/750.16 |
| 7,843,198 B2 * | 11/2010 | Sato et al. | 324/538 |
| 7,946,855 B2 * | 5/2011 | Osato | 439/66 |
| 7,982,487 B2 * | 7/2011 | Lorenz et al. | 324/763.01 |
| 2005/0035775 A1 * | 2/2005 | Zhou et al. | 324/754 |
| 2007/0018666 A1 * | 1/2007 | Barabi et al. | 324/761 |
| 2007/0145991 A1 * | 6/2007 | Yoshida | 324/754 |
| 2008/0224720 A1 * | 9/2008 | Kazama | 324/754 |
| 2009/0009205 A1 * | 1/2009 | Kazama | 324/761 |
| 2009/0311890 A1 * | 12/2009 | Nakayama et al. | 439/91 |

FOREIGN PATENT DOCUMENTS

| | | | |
|---|---|---|---|
| JP | 6-180328 A | 6/1994 | |
| JP | 09-005356 A | 1/1997 | |
| JP | 2002-048816 A | 2/2002 | |
| JP | 2002-048817 A | 2/2002 | |
| JP | 2002-062312 A | 2/2002 | |
| JP | 2002-107377 A | 4/2002 | |
| JP | 2002-350487 A | 12/2002 | |
| JP | 2003-021658 A | 1/2003 | |
| JP | 2005-019384 A | 1/2005 | |
| JP | 2006-170633 A | 6/2006 | |
| JP | 2007-322136 A | 12/2007 | |

OTHER PUBLICATIONS

Chinese Office Action issued Sep. 26, 2012 in corresponding Chinese Application No. 200980103792.2.

* cited by examiner

PROBE UNIT

TECHNICAL FIELD

The present invention relates to a probe unit for housing a conductive probe that performs input and output of a signal in an electrical characteristics test for a semiconductor integrated circuit or the like.

BACKGROUND ART

In an electrical characteristics test for a semiconductor integrated circuit such as an IC chip, a probe unit is used that houses a plurality of conductive probes at predetermined positions corresponding to an arrangement pattern of external electrodes included in the semiconductor integrated circuit. The probe unit includes a probe holder that has a plurality of hole portions into which contact probes are inserted, and, both end portions of the conductive probe held by the probe holder are brought into contact with an electrode of the semiconductor integrated circuit and an electrode of a circuit substrate for outputting a test signal, respectively, to electrically connect the semiconductor integrated circuit and the circuit substrate (see Patent Document 1 for example).

Patent Document 1: Japanese Laid-open Patent Publication No. 2002-107377

DISCLOSURE OF INVENTION

Problem to be Solved by the Invention

In recent years, a demand is growing for a probe capable of carrying large current with a current value of about 10 to 20 A for performing a test on a semiconductor for an automobile control system or the like. To meet this demand, it is necessary to make the diameter of the probe large. However, there is a problem in that when the maximum diameter or a pitch between electrodes of the semiconductor is 1 mm or smaller, the diameter of the probe needs to be made even smaller, resulting in reduced current-carrying capacity. Furthermore, in a test in which two probes are needed for each terminal as in the four-terminal measurement, probes with small diameters are needed, which leads to reduction in current-carrying capacity.

The present invention has been made in view of the above, and it is an object of the present invention to provide a probe unit capable of preventing reduction in current-carrying capacity due to a reduced diameter of a probe.

Means For Solving Problem

To solve the problem described above and achieve the object, a probe unit according to the present invention includes: a plurality of large diameter probes, each of which is formed by using conductive material and is extendable in a longitudinal direction; a plurality of small diameter probes, each of which is formed by using conductive material and has a diameter smaller than a diameter of each large diameter probe; a large-diameter probe holder that includes a plurality of large hole portions which individually hold the plurality of large diameter probes; and a plurality of reception hole portions, each of which has a diameter smaller than a diameter of each large hole portion, communicates with any one of the plurality of large hole portions, and receives an end portion of the small diameter probe so that the end portion comes into contact with the large diameter probe, wherein each set of one of the large hole portions and corresponding one of the small hole portions that communicate with each other pierces through the large-diameter probe holder in a thickness direction; and a small-diameter probe holder that includes a plurality of small hole portions which individually hold the plurality of small diameter probes while preventing the small diameter probes from coming off and which pierce through the small-diameter probe holder, and that is stacked on the large-diameter probe holder so that each of the small hole portions communicates with any one of the plurality of reception hole portions, wherein central axes of the large hole portion and the small hole portion that communicate with each other are separated from each other, and the plurality of small hole portions include two small hole portions which are adjacent to each other and of which central axes are separated from each other by a distance shorter than a distance between central axes of two large hole portions that are corresponding to the two small hole portions.

In the probe unit according to the present invention as set forth in the invention described above, each large diameter probe includes a first plunger which is formed approximately in a needle-shape; a second plunger of which tip is oriented in a direction opposite to a tip of the first plunger and which is brought into contact with any one of the small diameter probes; and an elastic member of which one end portion in the longitudinal direction is attached to the first plunger and the other end portion is attached to the second plunger, and which is extendable in the longitudinal direction.

In the probe unit according to the present invention as set forth in the invention described above, a tip of the second plunger forms a plane substantially normal to the longitudinal direction of the large diameter probes.

In the probe unit according to the present invention as set forth in the invention described above, the large-diameter probe holder includes a first substrate that holds the first plungers while allowing tip portions of the first plungers to be exposed; and a second substrate that is stacked on the first substrate and on the small-diameter probe holder, and receives end portions of the small diameter probes held by the small-diameter probe holder.

In the probe unit according to the present invention as set forth in the invention described above, the large diameter probes are pogo pins.

In the probe unit according to the present invention as set forth in the invention described above, tips of the pogo pins, the tips being in contact with the small diameter probes, form respective planes substantially normal to the longitudinal direction of the large diameter probes.

In the probe unit according to the present invention as set forth in the invention described above, the large-diameter probe holder includes a first substrate that holds the pogo pins while allowing tips of the pogo pins, the tips being not in contact with the small diameter probes, to be exposed; and a second substrate that is stacked on the first substrate and on the small-diameter probe holder and receives end portions of the small diameter probes held by the small-diameter probe holder.

In the probe unit according to the present invention as set forth in the invention described above, the small-diameter probe holder is constructed by stacking two substrates, each of which holds the small diameter probes while allowing either end of each of the small diameter probes to be exposed.

In the probe unit according to the present invention as set forth in the invention described above, the large-diameter probe holder and the small-diameter probe holder have insulation properties at at least portions in contact with the large diameter probes and/or the small diameter probes.

Effect of the Invention

According to a probe unit of the present invention, a set of probes is constructed by assembling a large diameter probe and a small diameter probe such that respective axis lines are shifted from each other. Therefore, even when it is necessary to deal with narrowing of a pitch of a test object, it is not necessary to reduce the diameters of both end portions of the probe. As a result, it is possible to prevent reduction in current-carrying capacity due to the reduced diameter of the probe.

EXPLANATIONS OF LETTERS OR NUMERALS 1, 7 Probe unit
2, 8 Large diameter probe
3 Small diameter prove
4 Large-diameter prove holder
4a Large hole portion
4b Reception hole portion
5 Small-diameter probe holder
5a Small hole portion
6 Holder member
21, 81 First plunger
21a, 23a, 31 Tip portion
21b, 33 Flange portion
21c, 23b Boss portion
21d, 23c, 32 Base end portion
22 Spring member
22a Loosely wound portion
22b Tightly wound portion
23, 82 Second plunger
41 First substrate
41a First hole portion
42 Second substrate
42a Second hole portion
51 Third substrate
51a Third hole portion
52 Fourth substrate
52a Fourth hole portion
83 Pipe member
100 Semiconductor integrated circuit
101, 201 Electrode
200 Circuit substrate 411a, 511a, 521a Small diameter hole
412a, 512a, 522a Large diameter hole

BEST MODE(S) FOR CARRYING OUT THE INVENTION

Best modes for carrying out the present invention (hereinafter, "embodiments") are explained below with reference to the accompanying drawings. It should be noted that the drawings are schematic and a relation between the thickness and the width of each portion, a ratio of the thicknesses of the respective portions, and the like may be different from realistic ones. It goes without saying that the drawings may depict some portion as having different relations and ratios of dimensions.

Figure 1:
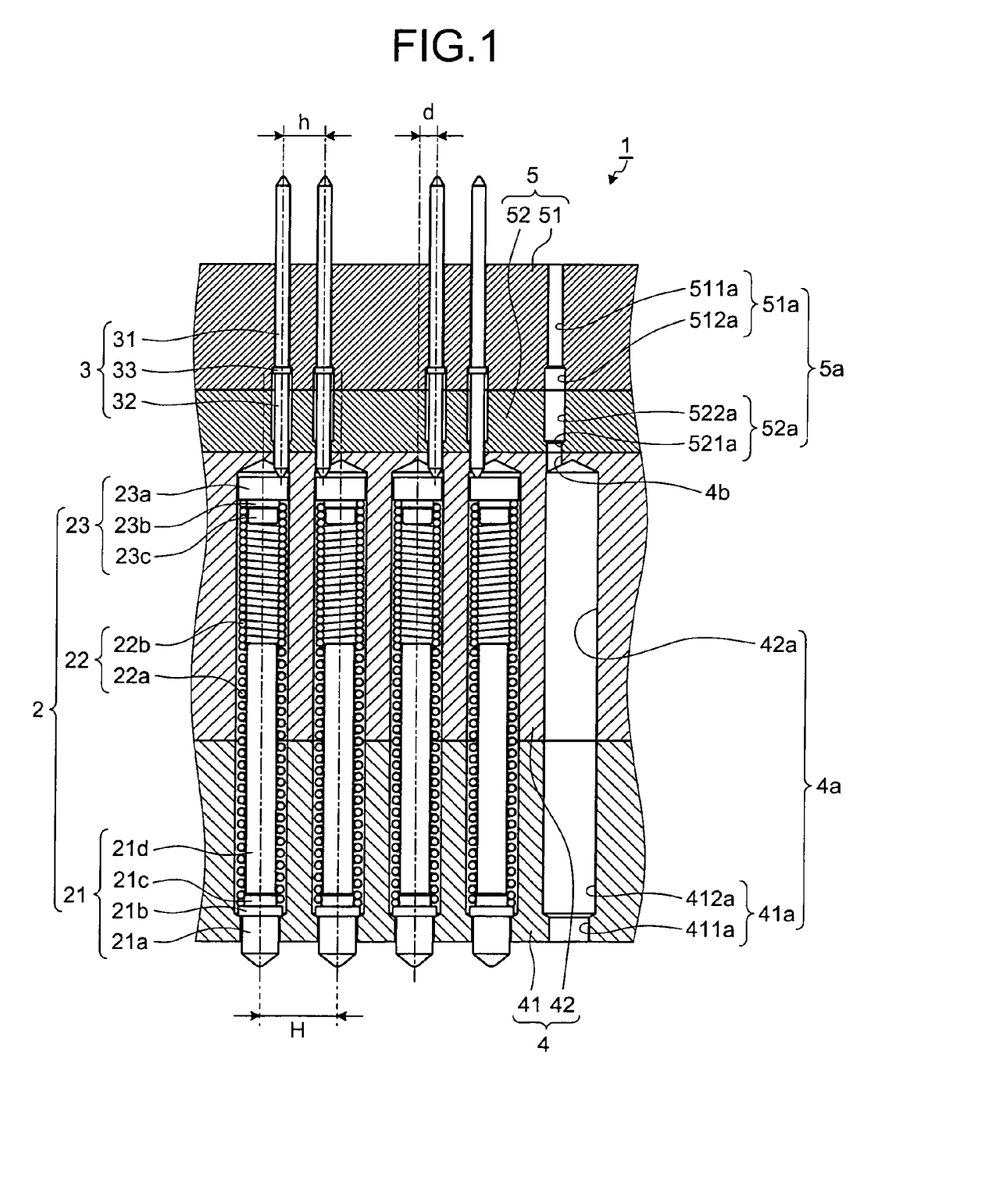
FIG. 1 is a diagram illustrating a configuration of a relevant portion of a probe unit according to an embodiment of the present invention.

FIG. 1 is a partial cross-sectional view of a configuration of a relevant portion of a probe unit according to an embodiment of the present invention. A probe unit 1 illustrated in the figure is a device that is used for performing an electrical characteristics test on a semiconductor integrated circuit as a test object, and that electrically connects the semiconductor integrated circuit and a circuit substrate that outputs a test signal to the semiconductor integrated circuit. The probe unit 1 includes a plurality of large diameter probes 2 of which one ends are brought into contact with electrodes of the circuit substrate, a plurality of small diameter probes 3, of which one ends are brought into contact with the large diameter probes 2 and other ends are brought into contact with electrodes of the semiconductor integrated circuit, and which have diameters smaller than those of the large diameter probes 2, a large-diameter probe holder 4 that holds the plurality of large diameter probes 2 while preventing the large diameter probes 2 from coming off, and a small-diameter probe holder 5 that is stacked on the large-diameter probe holder 4 in a detachable manner and holds the plurality of small diameter probes 3 while preventing the small diameter probes 3 from coming off.

Each large diameter probe 2 is formed by using conductive material, and includes a first plunger 21 which is formed approximately in a needle-shape, a spring member 22 of which one end is attached to the first plunger 21 and which is an elastic member extendable in the longitudinal direction, and a second plunger 23 to which the other end of the spring member 22 is attached and of which tip is oriented in a direction opposite to a tip of the first plunger 21. In the state illustrated in FIG. 1, the central axes in the longitudinal direction of the first plunger 21, the spring member 22, and the second plunger 23 coincide with each other.

The first plunger 21 includes a tip portion 21a having a sharp tip end, a flange portion 21b having a diameter larger than the diameter of the tip portion 21a, a boss portion 21c which projects in an opposite direction of the tip portion 21a via the flange portion 21b, which is in the form of a cylinder with a diameter that is smaller than the diameter of the flange portion 21b and is slightly larger than the inner diameter of the spring member 22, and onto which the end portion of the spring member 22 is press fitted, and a base end portion 21d which is in the form of a cylinder with a diameter that is smaller than the diameter of the boss portion 21c and is smaller than the inner diameter of the spring member 22.

The spring member 22 includes a loosely wound portion 22a of which end portion is press fitted onto the boss portion 21c of the first plunger 21, and a tightly wound portion 22b on which a wire rod that constructs the spring member 22 is more tightly wound than on the loosely wound portion 22a and of which end portion is press fitted onto the second plunger 23.

The loosely wound portion 22a and the tightly wound portion 22b are connected to each other and have the same diameters.

The second plunger 23 includes a tip portion 23a in the form of a cylinder, a boss portion 23b which is in the form of a cylinder with a diameter that is smaller than the diameter of the tip portion 23a and is slightly larger than the inner diameter of the spring member 22, and onto which the end portion of the tightly wound portion 22b is press fitted, and a base end portion 23c having a diameter that is smaller than the diameter of the boss portion 23b and is smaller than the inner diameter of the spring member 22. The outer diameter of the tip portion 23a is slightly larger than the outer diameter of the spring member 22. The length of the base end portion 23c can arbitrarily be set in a range in which the large diameter probe 2 does not come into contact with the first plunger 21 even when the large diameter probe 2 is stroked at the maximum. For example, it is possible to make the length of the base end portion 23c in the longitudinal direction longer than the length illustrated in FIG. 1. A tip face of the tip portion 23a, which forms a top surface of the second plunger 23 in FIG. 1, is a plane that is normal to the longitudinal direction of the large diameter probe 2 and is brought into contact with the small diameter probe 3.

Each small diameter probe 3 includes a tip portion 31 and a base end portion 32, each of which includes a sharp tip end, and a flange portion 33 which is arranged between the tip portion 31 and the base end portion 32 and has a diameter larger than the diameters of the tip portion 31 and the base end portion 32. The diameter of the tip portion 31 and the diameter of the base end portion 32 are substantially the same, and are smaller than the outer diameter of the large diameter probe 2. The tip of the base end portion 32 is brought into contact with the tip portion 23a of the second plunger 23 of the large diameter probe 2 as described above. The small diameter probe 3 is arranged at an offset position with respect to the large diameter probe 2 so that the central axis of the small diameter probe 3 is made parallel to and separated from the central axis of the large diameter probe 2.

The large-diameter probe holder 4 is constructed by stacking a first substrate 41 and a second substrate 42, which are formed by using insulating material such as resin, machinable ceramic, and silicone, in a thickness direction (in a vertical direction of FIG. 1). The large-diameter probe holder 4 includes a plurality of large hole portions 4a which individually hold the plurality of large diameter probes 2, and a plurality of reception hole portions 4b which have diameters smaller than the diameters of the large hole portions 4a, communicate with any one of the plurality of large hole portions 4a, and receive the base end portions 32 of the small diameter probes 3 so that the base end portions 32 come into contact with the large diameter probes 2. A set of the large hole portion 4a and the reception hole portion 4b that communicate with each other pierces through the large-diameter probe holder 4 in the thickness direction. Furthermore, the central axes in the longitudinal direction of the large hole portion 4a and the reception hole portion 4b that communicate with each other are parallel to and separated from each other. A distance d between the central axis of the large hole portion 4a and the central axis of the reception hole portion 4b is set to be smaller than a radius of a circle that forms the tip face of the tip portion 23a. By setting the distance d in this manner, the large diameter probe 2 and the small diameter probe 3, which are respectively inserted into the large hole portion 4a and the reception hole portion 4b that communicate with each other, can surely be brought into contact with each other.

On the first substrate 41 is formed a plurality of first hole portions 41a which form part of the large hole portions 4a. Each first hole portion 41a includes a small diameter hole 411a in the form of a cylinder hollow into which the tip portion 21a of the first plunger 21 is insertable, and a large diameter hole 412a in the form of a cylinder hollow which has a diameter larger than the diameter of the small diameter hole 411a and is coaxial with the small diameter hole 411a. The diameter of the small diameter hole 411a is smaller than the diameter of the flange portion 21b of the first plunger 21. The small diameter hole 411a prevents the first plunger 21 from coming off while allowing the tip portion 21a of the first plunger 21 to be exposed. Furthermore, the maximum diameter of the large diameter hole 412a is larger than the maximum diameter of the large diameter probe 2.

On the second substrate 42 are formed the plurality of reception hole portions 4b, and a plurality of second hole portions 42a, each of which forms part of the large hole portions 4a and pierces through the second substrate 42 in the thickness direction by communicating with corresponding one of the reception hole portions 4b. The diameters of the second hole portions 42a are the same as the diameters of the large diameter holes 412a. Each of the plurality of second hole portions 42a coaxially communicates with any one of the plurality of large diameter holes 412a at an end different from an end communicating with the reception hole portion 4b.

The small-diameter probe holder 5 is constructed by stacking a third substrate 51 and a fourth substrate 52, which are formed by using the same insulating material as that of the large-diameter probe holder 4, in the thickness direction (in the vertical direction of FIG. 1). On the small-diameter probe holder 5 is formed a plurality of small hole portions 5a which individually hold the plurality of small diameter probes 3 while preventing the small diameter probes 3 from coming off and which pierce through the small-diameter probe holder 5 in the thickness direction. The small-diameter probe holder 5 is stacked on the large-diameter probe holder 4 so that each of the plurality of small hole portions 5a coaxially communicates with any one of the plurality of reception hole portions 4b.

On the third substrate 51 is formed a plurality of third hole portions 51a which form part of the small hole portions 5a. Each third hole portion 51a includes a small diameter hole 511a which is in the form of a cylinder hollow which has a circular cross section and into which the tip portion 31 of the small diameter probe 3 is insertable, and a large diameter hole 512a in the form of a cylinder hollow which has a diameter larger than the diameter of the small diameter hole 511a and is coaxial with the small diameter hole 511a. The diameter of the small diameter hole 511a is smaller than the diameter of the flange portion 33 of the small diameter probe 3. Furthermore, the diameter of the large diameter hole 512a is large enough to house the flange portion 33 of the small diameter probe 3 and is substantially the same as the diameter of the flange portion 33. The third substrate 51 prevents the small diameter probes 3 from coming off while allowing the tip portions 31 of the small diameter probes 3 to be exposed.

On the fourth substrate 52 is formed a plurality of fourth hole portions 52a, each of which forms the small hole portion 5a by communicating with corresponding one of the third hole portions 51a. Each fourth hole portion 52a includes a small diameter hole 521a in the form of a cylinder hollow into which the base end portion 32 of the small diameter probe 3 is insertable, and a large diameter hole 522a in the form of a cylinder hollow which has a diameter larger than the diameter of the small diameter hole 521a and is coaxial with the small diameter hole 521a. The small diameter holes 521a communicate with the reception hole portions 4b. The diameters of the small diameter holes 521a are the same as the diameters of the reception hole portions 4b. Furthermore, the diameters of the large diameter holes 522a are the same as the diameters of the large diameter holes 512a. Each of the plurality of large diameter holes 522a coaxially communicates with any one of the plurality of large diameter holes 512a. The fourth substrate 52 prevents the small diameter probes 3 from coming off while allowing the base end portions 32 of the small diameter probes 3 to be exposed.

The large hole portions 4a, the reception hole portions 4b, and the small hole portions 5a are formed by performing drilling, etching, or punching, or performing a process using a laser, an electron beam, an ion beam, a wire electrical discharge, or the like.

The large-diameter probe holder 4 and the small-diameter probe holder 5 may be constructed by coating the surfaces of the substrates formed of conductive material (including portions corresponding to the side surfaces of the large hole portions 4a, the reception hole portions 4b, and the small hole portions 5a) with insulating material.

Figure 2:
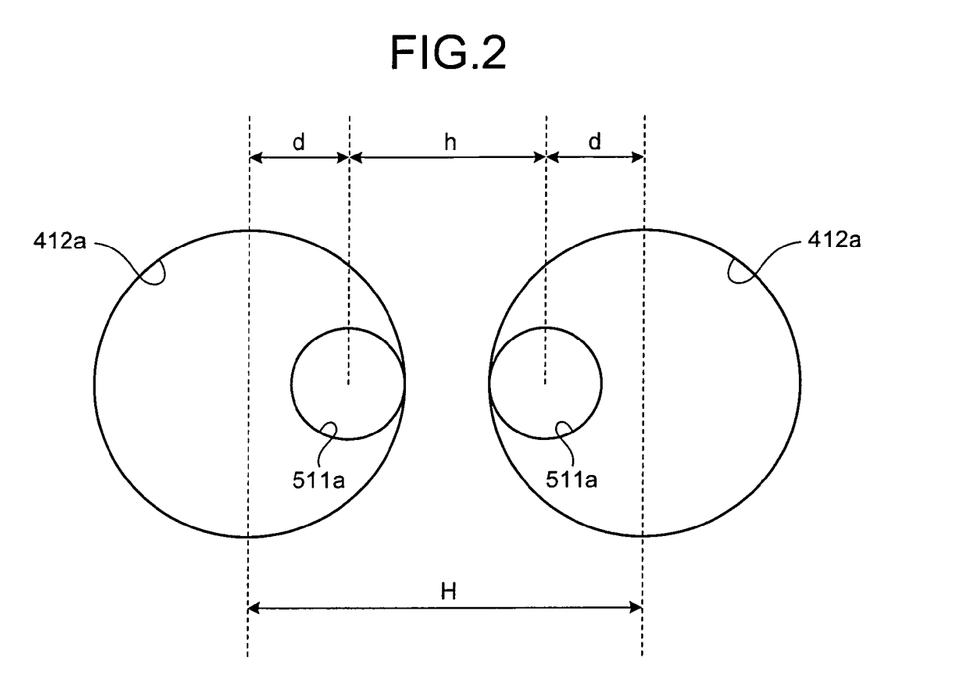
FIG. 2 is a diagram schematically illustrating a positional relationship between large hole portions and small hole portions.

FIG. 2 is a diagram schematically illustrating a positional relationship between the large hole portions 4a and the small hole portions 5a, and more specifically, illustrating a positional relationship between the large diameter holes 412a and the small diameter holes 511a. A distance H between the central axes of the large diameter holes 412a is larger than a distance h between the central axes of the small diameter holes 511a. Furthermore, in the large hole portion 4a and the small hole portion 5a that communicate with each other, a distance between the central axis of the large diameter hole 412a and the central axis of the small diameter hole 511a is equal to a distance d between the central axis of the large hole portion 4a and the central axis of the reception hole portion 4b. By setting the positional relationship between the large hole portions 4a and the small hole portions 5a in this manner, it is possible to narrow a pitch on the small diameter probe 3 side, which is to be in contact with a test object, than a pitch on the large diameter probe 2 side.

Figure 3:
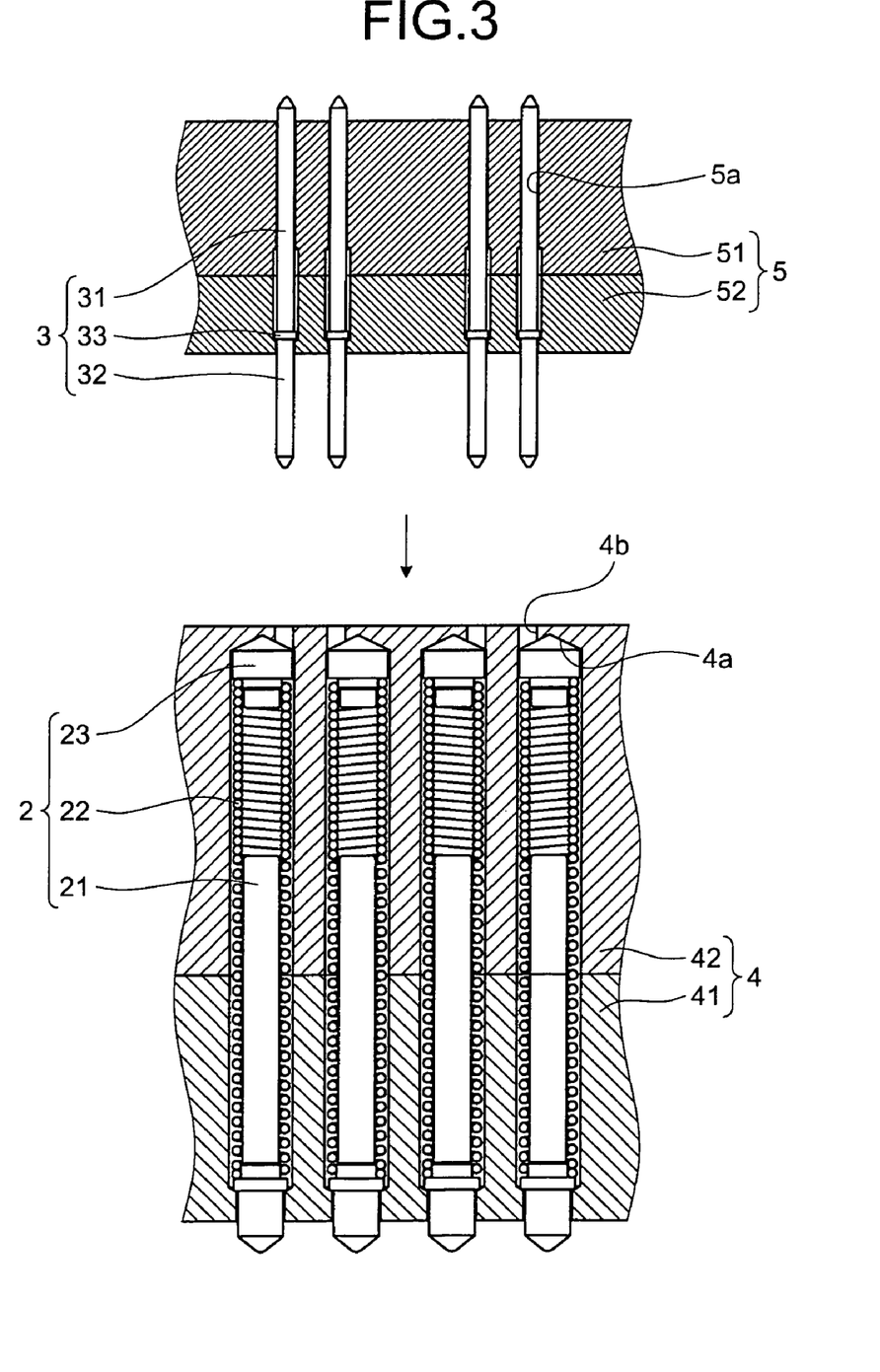
FIG. 3 is a diagram illustrating an overview of assembly of the probe unit according to the embodiment of the present invention.

FIG. 3 is a diagram illustrating an overview of assembly of the probe unit 1. When assembling the probe unit 1, two probe holders are combined with each other so that the second substrate 42 of the large-diameter probe holder 4 and the fourth substrate 52 of the small-diameter probe holder 5 face each other, and then joined together by using a screw or the like. If positioning openings are formed on the large-diameter probe holder 4 and the small-diameter probe holder 5 and positioning is performed by inserting a positioning pin into the opening of the large-diameter probe holder 4 and the corresponding opening of the small-diameter probe holder 5, the assembly of the probe unit 1 can be performed much easier and faster.

Figure 4:
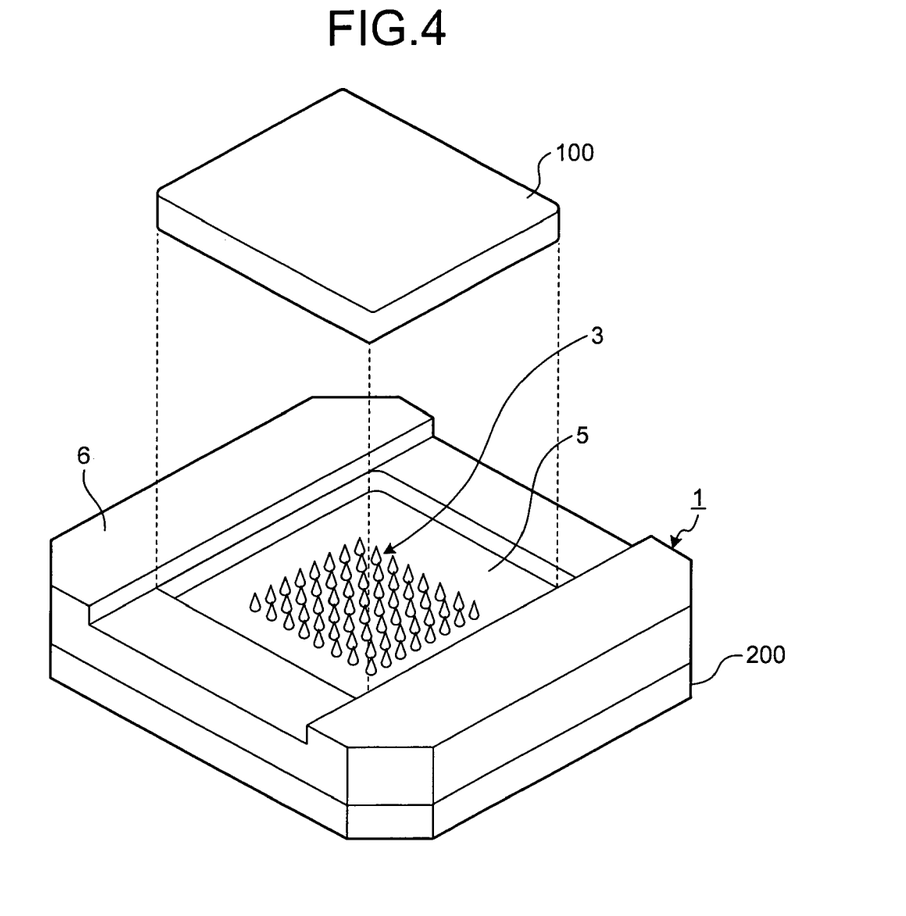
FIG. 4 is a perspective view schematically illustrating a whole structure of the probe unit according to the embodiment of the present invention.

FIG. 4 is a perspective view illustrating a whole structure of the probe unit 1 and an overview of an electrical characteristics test performed on a semiconductor integrated circuit by using the probe unit 1. In the probe unit 1, a holder member 6 for preventing occurrence of misalignment of a semiconductor integrated circuit 100 during a test is formed on the outer peripheries of the large-diameter probe holder 4 and the small-diameter probe holder 5. To the bottom surface side of the holder member 6 is attached a circuit substrate 200 that includes a circuit for outputting a test signal.

Figure 5:
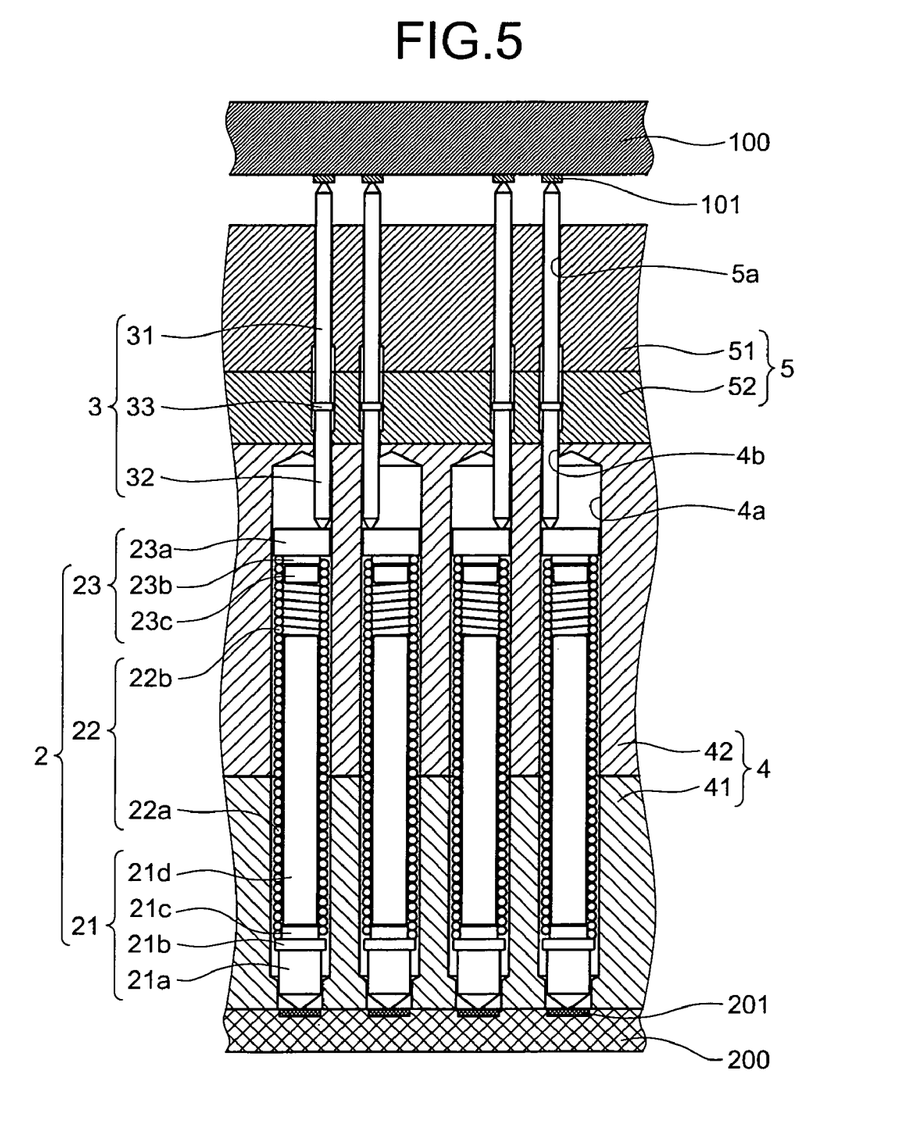
FIG. 5 is a diagram illustrating a test state of the probe unit according to the embodiment of the present invention.

FIG. 5 is a partial cross-sectional view of a configuration of a relevant portion of the probe unit 1 when a test is performed on the semiconductor integrated circuit 100. In the state illustrated in FIG. 5, the large diameter probes 2 are subjected to force in an upward direction of the figure because of contact with electrodes 201 of the circuit substrate 200. On the other hand, the small diameter probes 3 are subjected to force in a downward direction of the figure because of contact with electrodes 101 of the semiconductor integrated circuit 100. Therefore, the spring members 22 of the large diameter probes 2 are compressed in the longitudinal direction compared to those in the state where the small diameter probes 3 are not in contact with the electrodes 101 of the semiconductor integrated circuit 100.

A test signal generated at the time of a test of the semiconductor integrated circuit 100 reaches the electrode 101 of the semiconductor integrated circuit 100 via the electrode 201 of the circuit substrate 200, the first plunger 21, the tightly wound portion 22b, and the second plunger 23 of the large diameter probe 2, and the small diameter probe 3. In this manner, in the large diameter probe 2, because an electrical connection between the first plunger 21 and the second plunger 23 is established via the tightly wound portion 22b, the shortest conductive path for an electrical signal can be attained. Therefore, it is possible to prevent a signal from flowing into the loosely wound portion 22a at the time of a test, enabling to lower and stabilize the inductance and the resistance.

When the probe unit 1 repeatedly performs a test, the small diameter probes 3 are repeatedly brought into contact with and separated from the electrodes 101, so that the tip portions 31 may be worn away or the small diameter probes 3 may be damaged due to a long term use. In such a case, in the embodiment, because the small-diameter probe holder 5 can be detached from the large-diameter probe holder 4, it is possible to easily change only the small diameter probes 3.

According to the embodiment of the present invention as described above, a set of probes is constructed by assembling the large diameter probe and the small diameter probe such that respective axis lines are shifted from each other. Therefore, even when it is necessary to deal with narrowing of a pitch of a test object, it is not necessary to reduce the diameters of both end portions of the probe. As a result, it is possible to prevent reduction in current-carrying capacity due to the reduced diameter of the probe.

Furthermore, according to the embodiment, it is possible to change the small diameter probe, which is easily worn away over time and is most likely to cause increase in a contact resistance value, independent of a large diameter probe. Therefore, maintenance can be performed easily. In addition, because only the small diameter probe is changed, the large diameter probe holder can continuously be used unless any problems occur. Therefore, it is possible to save the large diameter probe, which is cost effective.

Moreover, according to the embodiment, because the second plunger of the large diameter probe and the small diameter probe are machined separately, machining can be made easier than in a case where the large diameter probe and the small diameter probe are integrally formed so as to be offset from each other.

When the large diameter probe and the small diameter probe are integrally formed so as to be offset from each other, the probe does not have an axisymmetric shape. Therefore, when the integrally-formed probe is housed in the probe holder, it is necessary to perform positioning in consideration of a position of a hole portion into which a portion corresponding to the small diameter probe is to be inserted, so that operation of housing the probe becomes cumbersome, which is problematic. In contrast, in the present embodiment, because the large diameter probe and the small diameter probe are separated from each other and each probe is formed so as to have an axisymmetric shape, it is possible to easily house each probe in the probe holder.

Figure 6:
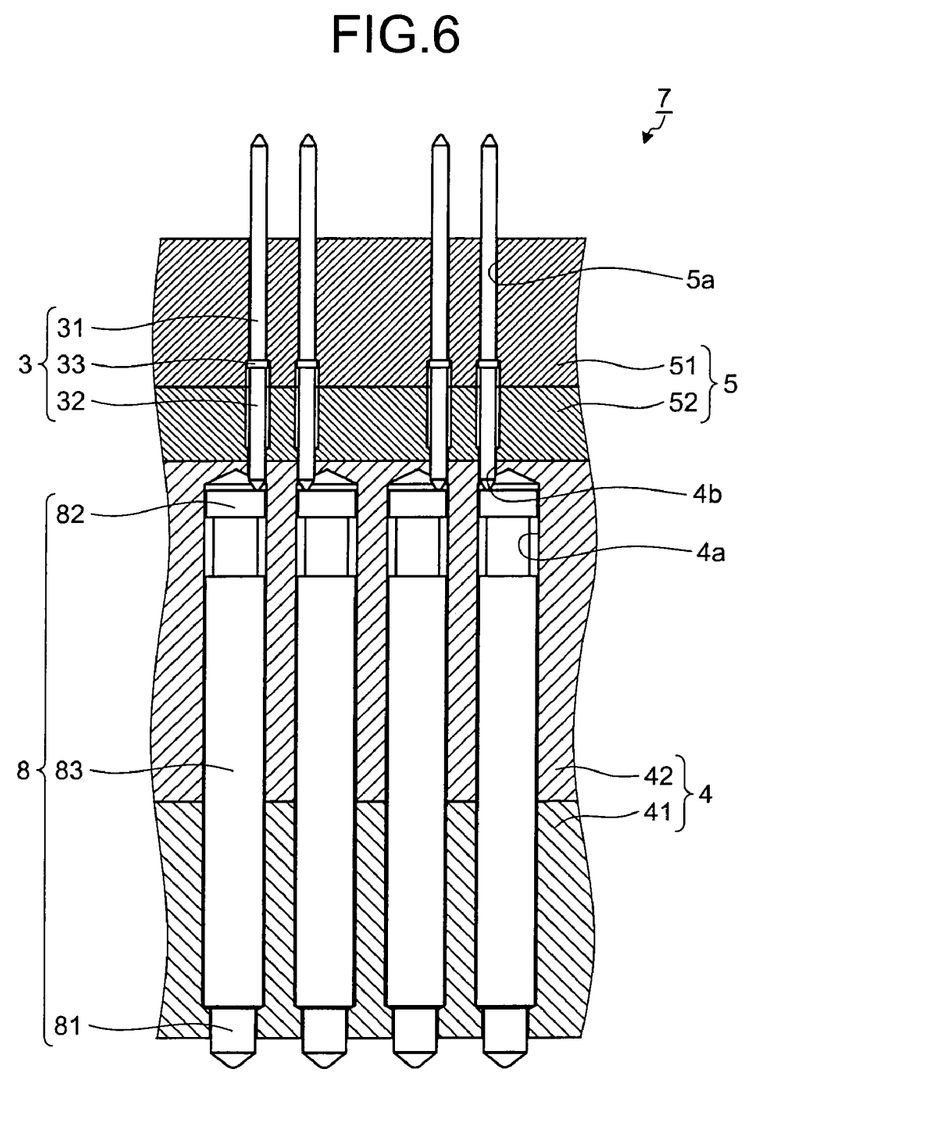
FIG. 6 is a diagram illustrating a configuration of a probe unit according to another embodiment of the present invention.

The embodiment is described above as best modes for carrying out the present invention; however, the present invention should not be limited to the above embodiment. FIG. 6 is a partial cross-sectional view of a configuration of a relevant portion of a probe unit according to another embodiment of the present invention. A probe unit 7 illustrated in the figure has the same configuration as that of the probe unit 1 described above except for a configuration of a large diameter probe. A large diameter probe 8 included in the probe unit 7 is a pogo pin, and includes a first plunger 81, a second plunger 82, and a pipe member 83 that covers the outer periphery of a spring member (not shown) interposed between the first plunger 81 and the second plunger 82. A tip of the second plunger 82 forms a plane that is normal to the longitudinal direction of the large diameter probe 8. With the probe unit 7 having such a configuration, it is possible to obtain the same advantages as those of the embodiment described above.

As is apparent in the above description, the present invention can include various embodiments and the like not described here, and various design changes and the like can be made in the range without departing from the technical idea as specified by the claims.

INDUSTRIAL APPLICABILITY

As described above, the probe unit according to the embodiment is useful for performing an electrical characteristics test on a semiconductor integrated circuit such as an IC chip.

The invention claimed is:

1. A probe unit comprising:
    a plurality of large diameter probes, each of which is formed by using conductive material and is extendable in a longitudinal direction;
    a plurality of small diameter probes, each of which is formed by using conductive material and has a diameter smaller than a diameter of each large diameter probe;
    a large-diameter probe holder that includes
        a plurality of large hole portions which individually hold the plurality of large diameter probes; and
        a plurality of reception hole portions, each of which has a diameter smaller than a diameter of each large hole portion, communicates with any one of the plurality of large hole portions, and receives an end portion of the small diameter probe so that the end portion comes into physical contact with the large diameter probe, wherein
        each set of one of the large hole portions and corresponding one of the reception hole portions that communicate with each other pierces through the large-diameter probe holder in a thickness direction; and
    a small-diameter probe holder that includes a plurality of small hole portions which individually hold the plurality of small diameter probes while preventing the small diameter probes from coming off and which pierce through the small-diameter probe holder, and that is stacked on the large-diameter probe holder so that each of the small hole portions communicates with any one of the plurality of reception hole portions, wherein
    central axes of the large hole portion and the small hole portion that communicate with each other are separated from each other, and
    the plurality of small hole portions include two small hole portions which are adjacent to each other and of which central axes are separated from each other by a distance shorter than a distance between central axes of two large hole portions that are corresponding to the two small hole portions.

2. The probe unit according to claim 1, wherein each large diameter probe includes
    a first plunger which is formed approximately in a needle-shape;
    a second plunger of which tip is oriented in a direction opposite to a tip of the first plunger and which is brought into contact with any one of the small diameter probes; and
    an elastic member of which one end portion in the longitudinal direction is attached to the first plunger and the other end portion is attached to the second plunger, and which is extendable in the longitudinal direction.

3. The probe unit according to claim 2, wherein a tip of the second plunger forms a plane substantially normal to the longitudinal direction of the large diameter probes.

4. The probe unit according to claim 2, wherein the large-diameter probe holder includes
    a first substrate that holds the first plungers while allowing tip portions of the first plungers to be exposed; and
    a second substrate that is stacked on the first substrate and on the small-diameter probe holder, and receives end portions of the small diameter probes held by the small-diameter probe holder.

5. The probe unit according to claim 1, wherein the large diameter probes are pogo pins.

6. The probe unit according to claim 5, wherein tips of the pogo pins, the tips being in contact with the small diameter probes, form respective planes substantially normal to the longitudinal direction of the large diameter probes.

7. The probe unit according to claim 5, wherein the large-diameter probe holder includes
    a first substrate that holds the pogo pins while allowing tips of the pogo pins, the tips being not in contact with the small diameter probes, to be exposed; and
    a second substrate that is stacked on the first substrate and on the small-diameter probe holder and receives end portions of the small diameter probes held by the small-diameter probe holder.

8. The probe unit according to claim 1, wherein the small-diameter probe holder is constructed by stacking two substrates, each of which holds the small diameter probes while allowing either end of each of the small diameter probes to be exposed.

9. The probe unit according to claim 1, wherein the large-diameter probe holder and the small-diameter probe holder have insulation properties at-on at least portions in contact with the large diameter probes and/or the small diameter probes.

* * * * *